(12) United States Patent
Matsuzawa

(10) Patent No.: US 11,031,908 B2
(45) Date of Patent: Jun. 8, 2021

(54) VIBRATION DEVICE, ELECTRONIC APPARATUS, AND VEHICLE

(71) Applicant: SEIKO EPSON CORPORATION, Tokyo (JP)

(72) Inventor: Yusuke Matsuzawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/003,091

(22) Filed: Aug. 26, 2020

(65) Prior Publication Data

US 2021/0067093 A1 Mar. 4, 2021

(30) Foreign Application Priority Data

Aug. 29, 2019 (JP) .............................. JP2019-157280

(51) Int. Cl.
| | |
|---|---|
| *H03B 5/04* | (2006.01) |
| *H03L 1/04* | (2006.01) |
| *H03L 1/02* | (2006.01) |
| *H03B 5/32* | (2006.01) |

(52) U.S. Cl.
CPC ................. *H03B 5/04* (2013.01); *H03B 5/32* (2013.01); *H03L 1/028* (2013.01); *H03L 1/04* (2013.01)

(58) Field of Classification Search
CPC .... H03B 5/04; H03B 5/32; H03L 1/04; H03L 1/028
See application file for complete search history.

(56) References Cited

U.S. PATENT DOCUMENTS

| | | | |
|---|---|---|---|
| 2004/0036546 A1* | 2/2004 | Arai | H03H 9/0547 |
| | | | 331/158 |
| 2017/0272081 A1* | 9/2017 | Chiang | H01L 23/345 |
| 2017/0373693 A1* | 12/2017 | Kondo | H03L 1/04 |
| 2018/0234052 A1* | 8/2018 | Noto | H03H 9/02102 |

FOREIGN PATENT DOCUMENTS

| | | |
|---|---|---|
| JP | 8-65051 | 3/1996 |
| JP | 2004-128591 | 4/2004 |
| JP | 2007-129326 | 5/2007 |
| JP | 2009-118000 | 5/2009 |
| JP | 2009-278211 | 11/2009 |
| JP | 2012-050057 | 3/2012 |
| JP | 2014-205235 | 10/2014 |

\* cited by examiner

*Primary Examiner* — Jeffrey M Shin
(74) *Attorney, Agent, or Firm* — Rankin, Hill & Clark LLP

(57) ABSTRACT

A vibration device includes: a first substrate including a first surface and a second surface located at an opposite side of the first surface, and a first integrated circuit disposed on at least one of the first surface and the second surface; a second substrate including a third surface bonded to the second surface, a fourth surface located at an opposite side of the third surface, a recess that opens to the third surface, and a second integrated circuit disposed on the fourth surface; and a vibration element accommodated in a space defined by an opening of the recess being closed by the first substrate.

10 Claims, 15 Drawing Sheets

FIG. 3
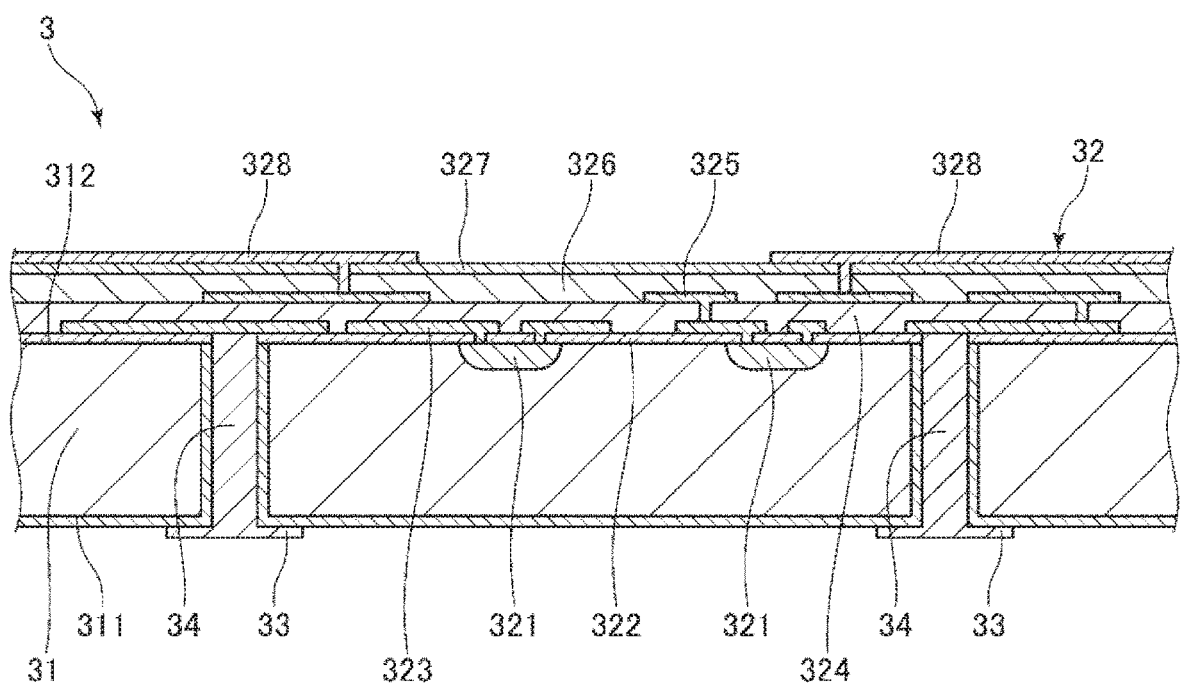
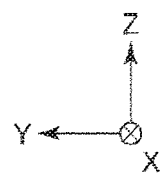

VIBRATION DEVICE, ELECTRONIC APPARATUS, AND VEHICLE

The present application is based on, and claims priority from JP Application Serial Number 2019-157280, filed Aug. 29, 2019, the disclosure of which is hereby incorporated by reference herein in its entirety

BACKGROUND

1. Technical Field

The present disclosure relates to a vibration device, an electronic apparatus, and a vehicle.

2. Related Art

JP-A-2009-118000 describes a piezoelectric device including a first semiconductor substrate on which a first integrated circuit is formed, a second semiconductor substrate on which a second integrated circuit is formed, and an element substrate having a vibration element and a frame portion surrounding the vibration element. The element substrate is located between the first semiconductor substrate and the second semiconductor substrate, a lower surface of the frame portion is bonded to an upper surface of the first semiconductor substrate, and an upper surface of the frame portion is bonded to a lower surface of the second semiconductor substrate. Further, the vibration element is accommodated in a space surrounded by the first semiconductor substrate, the second semiconductor substrate, and the frame portion.

However, in the vibration device having such a configuration, since three members, that is, the first semiconductor substrate, the second semiconductor substrate, and the frame portion form the space that accommodates the vinration element, it is difficult to reduce a thickness of the vibration device.

SUMMARY

A vibration device according to an application example includes a first substrate including a first surface and a second surface located at an opposite side of the first surface, and a first integrated circuit disposed on at least one of the first surface and the second surface; a second substrate having a third surface bonded to the second surface, a fourth surface located at an opposite side of the third surface, a recess that opens to the third surface, and a second integrated circuit disposed on the fourth surface; and a vibration element accommodated in a space defined by an opening of the recess being closed by the first substrate.

In the vibration device according to the application example, the vibration element may be fixed to the first substrate.

In the vibration device according to the application example, the first integrated circuit may include an oscillation circuit configured to cause the vibration element to oscillate, and the second integrated circuit may include a processing circuit configured to process an oscillation signal output from the oscillation circuit.

The vibration device according to the application example may further include a temperature detection element configured to detect a temperature of the vibration element, and one of the first integrated circuit and the second integrated circuit may include a temperature compensation circuit configured to perform temperature compensation of the oscillation signal based on a detection result of the temperature detection element.

In the vibration device according to the application example, the second substrate may include a through electrode that electrically couples the first integrated circuit and the second integrated circuit.

In the vibration device according to the application example, an integrated circuit may not be disposed on the third surface.

In the vibration device according to the application example, the first integrated circuit may be disposed on any one of the first surface and the second surface.

In the vibration device according to the application example, a pressure detection unit configured to detect a pressure inside the space may be disposed on at least one of the first substrate and the second substrate.

An electronic apparatus according to an application example includes the vibration device described above, and an arithmetic processing circuit configured to operate based on a signal output from the vibration device.

A vehicle according to an application example includes the vibration device described above, and an arithmetic processing circuit configured to operate based on a signal output from the vibration device.

BRIEF DESCRIPTION OF THE DRAWINGS

FIG. 3 is a cross-sectional view taken along a line B-B in FIG. 1.

DESCRIPTION OF EXEMPLARY EMBODIMENTS

Hereinafter, a vibration device, an electronic apparatus, and a vehicle according to aspects of the present disclosure will be described in detail based on embodiments shown in the accompanying drawings.

First Embodiment

Figure 1:
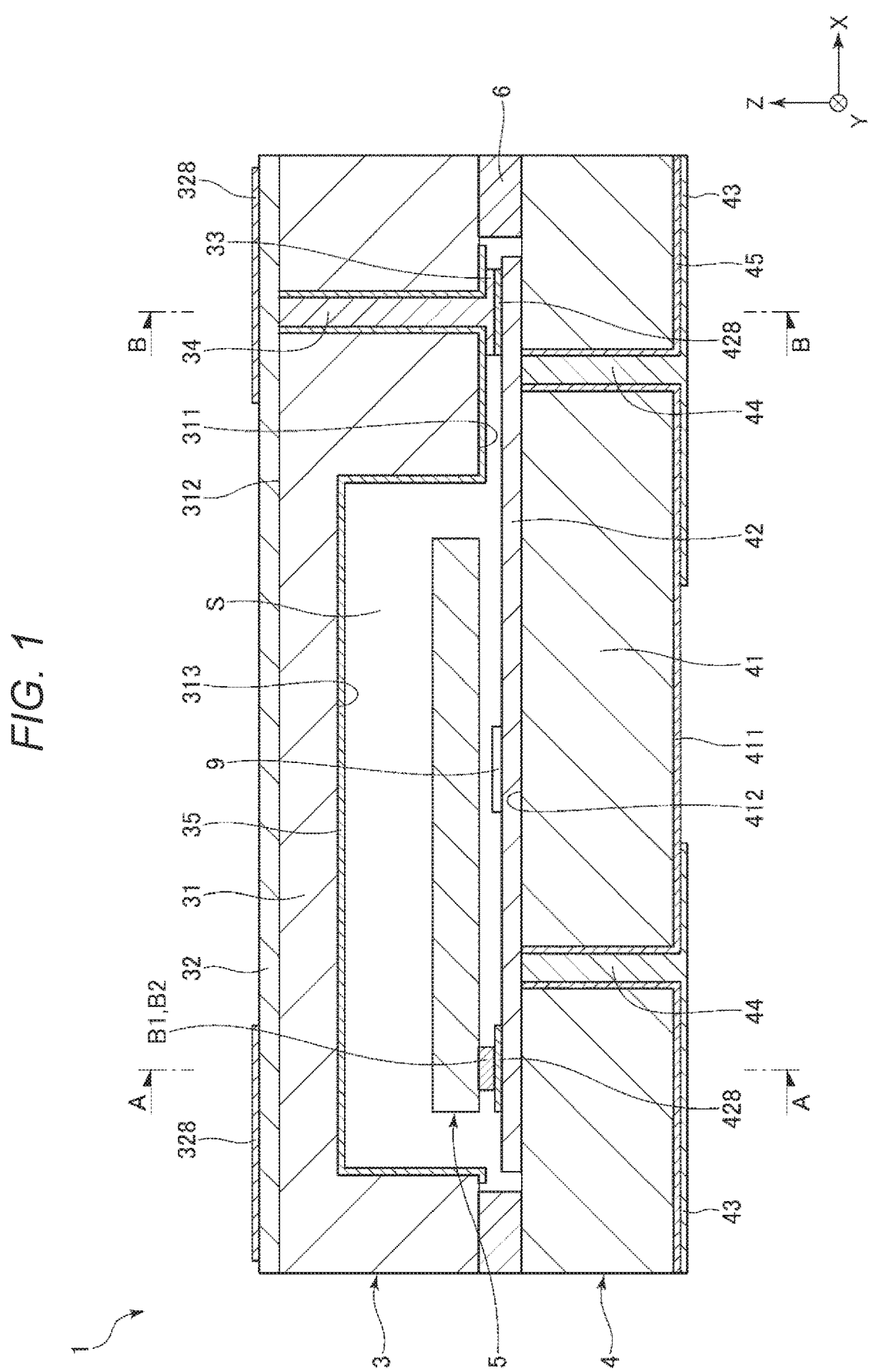
FIG. 1 is a cross-sectional view showing a vibration device according to a first embodiment.
Figure 2:
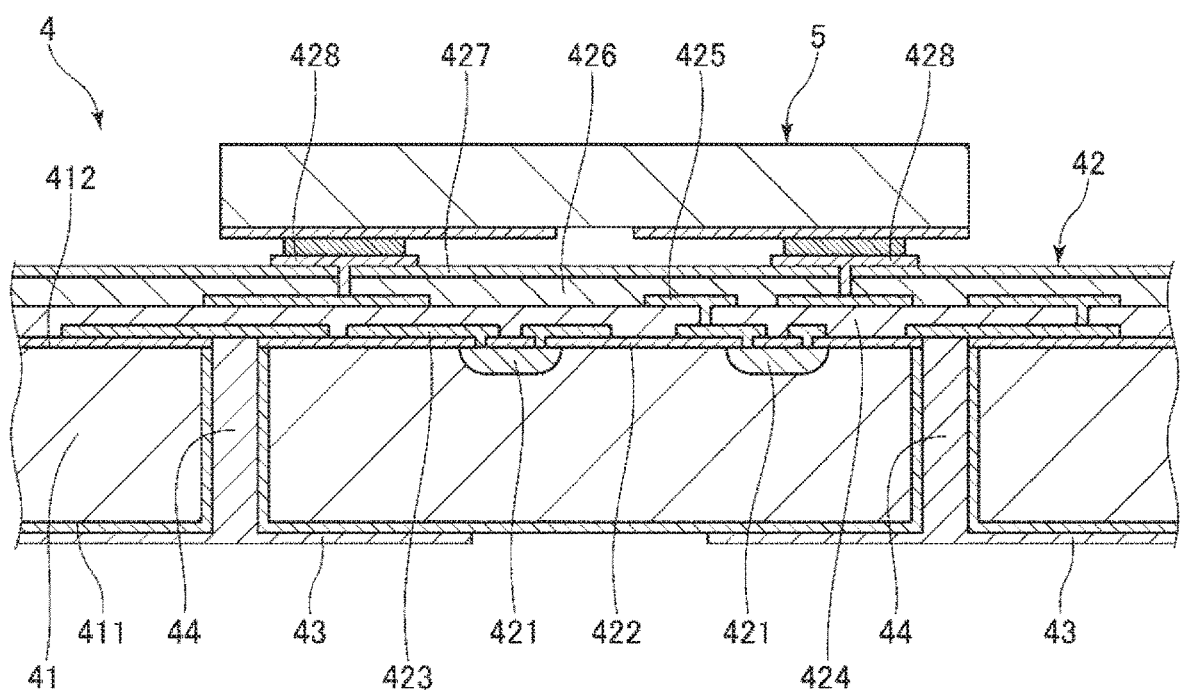
FIG. 2 is a cross-sectional view taken along a line A-A in FIG. 1.
Figure 4:
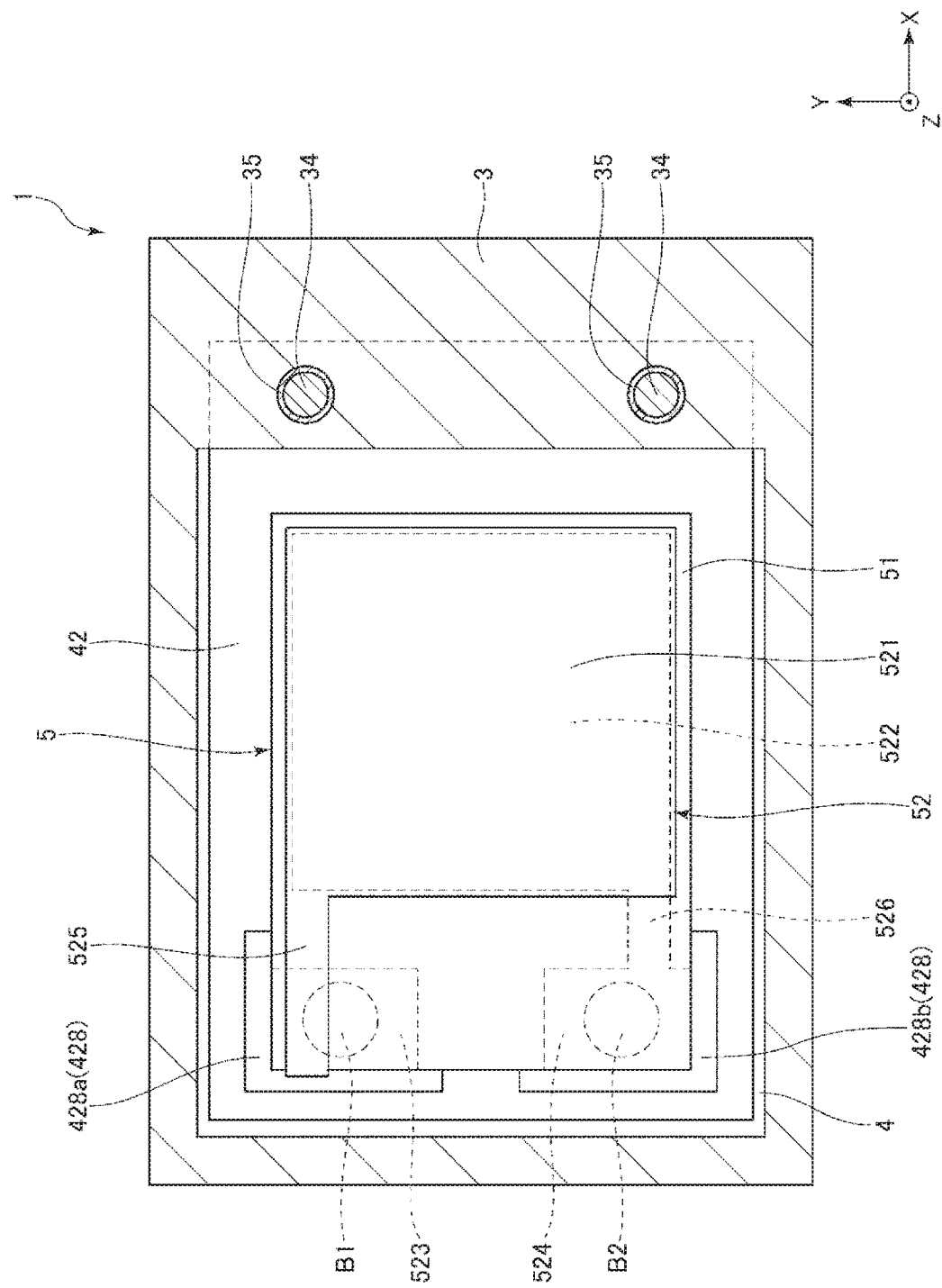
FIG. 4 is a cross-sectional view showing a vibration element.
Figure 5:
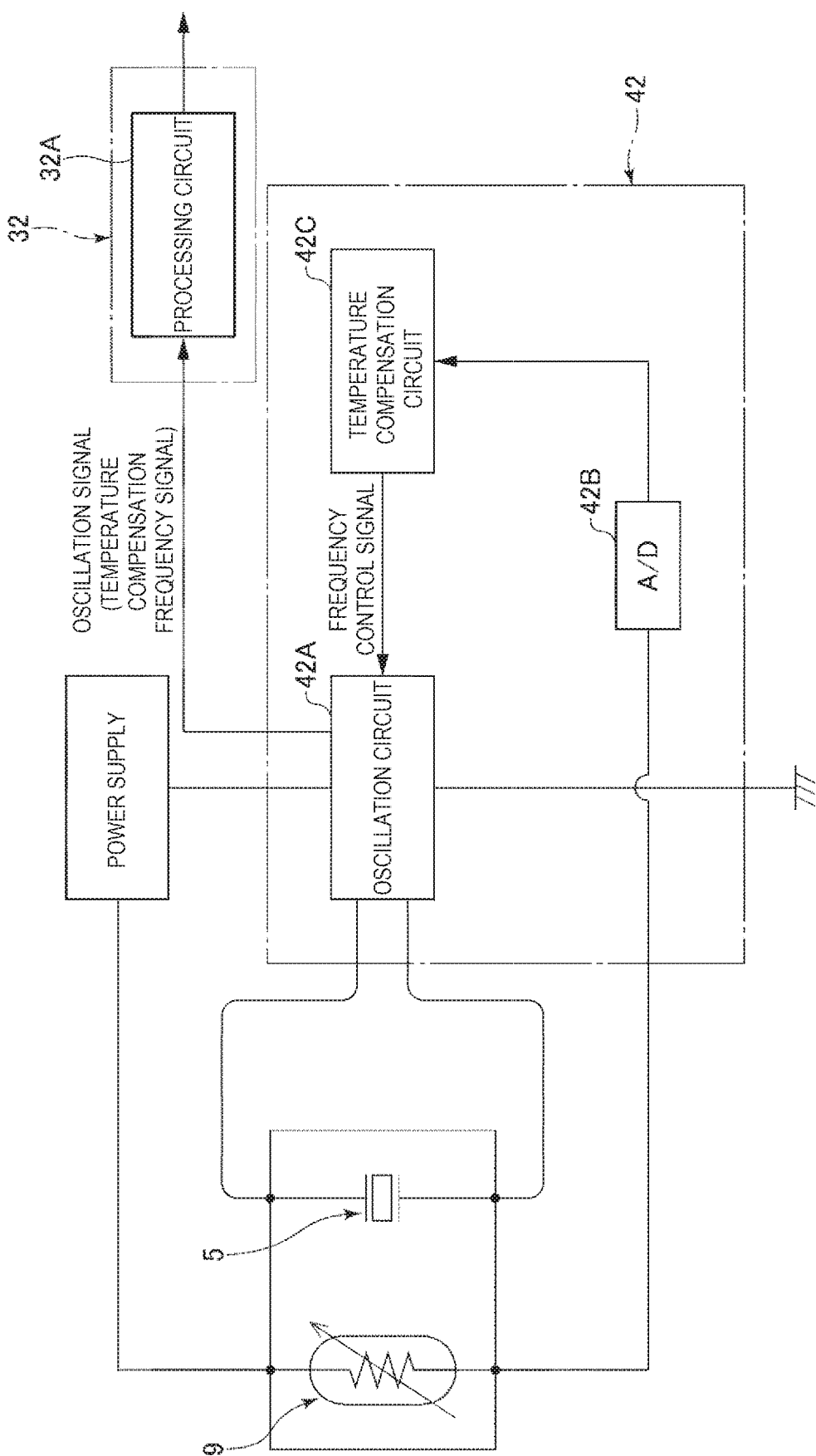
FIG. 5 is a block diagram showing a circuit configuration.

FIG. 1 is a cross-sectional view showing a vibration device according to a first embodiment. FIG. 2 is a cross-sectional view taken along a line A-A in FIG. 1. FIG. 3 is a cross-sectional view taken along a line B-B in FIG. 1. FIG. 4 is a cross-sectional view showing a vibration element. FIG. 5 is a block diagram showing a circuit configuration. For convenience of explanation, FIGS. 1 to 4 show three axes orthogonal to one another as an X axis, a Y axis, and a Z axis. Further, a tip end side of the Z axis is also referred to as "upper", and a base end side is also referred to as "lower". Further, a thickness direction of a base substrate, that is, a plan view along the Z axis is also simply referred to as a "plan view".

A vibration device 1 shown in FIG. 1 is used, for example, as an oscillator. The vibration device 1 as described above includes a base 4 serving as a first substrate, a lid 3 serving as a second substrate bonded to the base 4, and a vibration element 5 accommodated in a space S formed between the base 4 and the lid 3. With such a configuration, the space S for accommodating the vibration element 5 is formed by the base 4 and the lid 3, that is, the two substrates. Therefore, as compared with a configuration in which the space S is formed by three substrates as in an above-described technique of related art, the vibration device 1 can be miniaturized, particularly thinned.

In the present specification, "bonded" includes not only a case of only directly being bonded, but also a case of indirectly being bonded through some intervening material, for example, a case in which surfaces are directly bonded via a bonding member 6 as to be described later.

Firstly, the base 4 will be described. The base 4 includes a plate-shaped base substrate 41 having a lower surface 411 that is a first surface and an upper surface 412 that is a second surface located at an opposite side of the lower surface 411, a first integrated circuit 42 disposed on the upper surface 412, a plurality of terminals 43 disposed on the lower surface 411, and a plurality of through electrodes 44 that penetrate the base substrate 41 in a thickness direction thereof and electrically couple the respective terminals 43 and the first integrated circuit 42. Insulating films 45 are disposed between each terminal 43 and the base substrate 41 and between each through electrode 44 and the base substrate 41, and the insulating films 45 electrically insulate the terminals 43 and the base substrate 41 and electrically insulate the through electrodes 44 and the base substrate 41.

The base substrate 41 is a silicon substrate. In addition, the terminal 43 and the through electrode 44 may be made of aluminum, nickel, palladium, gold, copper, or the like, or a combination of two or more of these. The insulating film 45 may be made of silicon oxide, tungsten, copper, or the like. By selecting such materials, the base 4 can be formed by using a semiconductor process. However, the base substrate 41 is not particularly limited, and for example, a silicon on insulator (SOI) substrate formed by inserting a silicon oxide film between a pair of silicon substrates may be used. As a result, a speed of the first integrated circuit 42 can be increased and power consumption can be reduced. The base substrate 41 may be a semiconductor substrate other than the silicon substrate, for example, a substrate made of germanium, gallium arsenide, gallium arsenide phosphide, gallium nitride, silicon carbide, or the like. Further, constituent materials of the terminal 43, the through electrode 44, and the insulating film 45 are not particularly limited as long as functions of these parts can be exhibited.

Further, as shown in FIG. 2, the first integrated circuit 42 includes a plurality of circuit elements 421 such as transistors, diodes, resistors and capacitors formed on the base substrate 41 by doping the base substrate 41 with impurities such as phosphorus, boron and arsenic from an upper surface 412 side, an insulating film 422 stacked on the upper surface 412, a wiring 423 stacked on the insulating film 422, an insulating film 424 that covers the wiring 423 and is stacked on the insulating film 422, a wiring 425 stacked on the insulating film 424 and electrically coupled to the wiring 423, an insulating film 426 that covers the wiring 425 and is stacked on the insulating film 424, a passivation film 427 stacked on the insulating film 426, and a plurality of terminals 428 stacked on the passivation film 427 and electrically coupled to the wiring 425. However, the configuration of the first integrated circuit 42 is not particularly limited as long as a function of the first integrated circuit 42 can be exhibited.

Therefore, the first integrated circuit 42 is disposed only on the upper surface 412 and is not disposed on the lower surface 411. By disposing the first integrated circuit 42 on only one of the lower surface 411 and the upper surface 412, the configuration of the base 4 and formation thereof are easier than, for example, a case of disposing the first integrated circuit 42 on both surfaces. Particularly, in this embodiment, the first integrated circuit 42 is disposed on the upper surface 412. Therefore, exposure of the first integrated circuit 42 to an outside of the vibration device 1 is prevented, and the first integrated circuit 42 can be protected from moisture, contact, dust, and the like.

Further, as shown in FIG. 1, a temperature detection element 9 electrically coupled to the first integrated circuit 42 is disposed on the first integrated circuit 42, and a temperature of the vibration element 5 can be detected by this temperature detection element 9. The temperature detection element 9 is not particularly limited, and for example, a thermistor element, particularly a thin film thermistor element can be used. In this embodiment, the temperature detection element 9 is disposed to overlap the vibration element 5 in a plan view from a thickness direction of the vibration device 1. Therefore, the temperature detection element 9 can be disposed in a vicinity of the vibration element 5, and the temperature of the vibration element 5 can be more accurately detected by the temperature detection element 9 accordingly. However, an arrangement of the temperature detection element 9 is not particularly limited.

Next, the lid 3 will be described. As shown in FIG. 1, the lid 3 includes a plate-shaped base substrate 31 having a lower surface 311 that is a third surface and an upper surface 312 that is a fourth surface located at an opposite side of the lower surface 311, a second integrated circuit 32 disposed on the upper surface 312, a plurality of terminals 33 disposed on the lower surface 311, and a plurality of through electrodes 34 that penetrate the base substrate 31 in a thickness direction thereof and electrically couple each terminal 33 and the second integrated circuit 32. Insulating films 35 are disposed between each terminal 33 and the base substrate 31 and between each through electrode 34 and the base substrate 31, and the insulating films 35 electrically insulate the terminals 33 and the base substrate 31 and electrically insulate the through electrodes 34 and the base substrate 31. In addition, the base substrate 31 has a recess 313 that opens to the lower surface 311 thereof. An opening of the recess 313 is closed by the base 4, and thereby the space S is formed between the base 4 and the lid 3. Then, the vibration element 5 is accommodated in this space S.

The base substrate 31 is a silicon substrate. The terminal 33 and the through electrode 34 are made of aluminum, and the insulating film 35 is made of silicon oxide. By selecting such materials, the lid 3 can be formed by using the semiconductor process. However, the base substrate 31 is not particularly limited, and for example, an SOI substrate formed by inserting a silicon oxide film between a pair of silicon substrates may be used. As a result, a speed of the second integrated circuit 32 can be increased and the power consumption can be reduced. The base substrate 31 may be a semiconductor substrate other than the silicon substrate, for example, a substrate made of germanium, gallium arsenide, gallium arsenide phosphide, gallium nitride, silicon carbide, or the like. Further, constituent materials of the terminal 33, the through electrode 34, and the insulating film 35 are not particularly limited as long as functions of these parts can be exhibited.

Further, as shown in FIG. 3, the second integrated circuit 32 includes a plurality of circuit elements 321 such as transistors, diodes, resistors and capacitors formed on the base substrate 31 by doping the base substrate 31 with impurities such as phosphorus, boron and arsenic from an upper surface 312 side, an insulating film 322 stacked on the upper surface 312, a wiring 323 stacked on the insulating film 322, an insulating film 324 that covers the wiring 323 and is stacked on the insulating film 322, a wiring 325 stacked on the insulating film 324 and electrically coupled to the wiring 323, an insulating film 326 that covers the wiring 325 and is stacked on the insulating film 324, a passivation film 327 stacked on the insulating film 326, and a plurality of terminals 328 stacked on the passivation film 327 and electrically coupled to the wiring 325. However, the configuration of the second integrated circuit 32 is not particularly limited as long as a function of the second integrated circuit 32 can be exhibited.

Therefore, the second integrated circuit 32 is disposed only on the upper surface 312 and is not disposed on the lower surface 311. By disposing the second integrated circuit 32 on only the upper surface 312, the configuration of the lid 3 and formation thereof are easier than, for example, a case of disposing the second integrated circuit 32 on both surfaces. In particular, in this embodiment, since the recess 313 that opens to the lower surface 311 is formed, there is not much space left on the lower surface 311 to form the second integrated circuit 32. Further, formation of the second integrated circuit 32 on a bottom surface of the recess 313 is relatively difficult. Further, when the second integrated circuit 32 is disposed only on the upper surface 312, the through electrode 34 can be easily formed in the lid 3. Specifically, first, a via penetrating the lid 3 is formed from a lower surface 311 side by using a bosch process or the like, and the through electrode 34 can be formed by filling the via with a metal material. According to such a method, since the base substrate 31 can be attacked from a back side of the second integrated circuit 32, the second integrated circuit 32 can be effectively prevented from being damaged when the through electrode 34 is formed. Therefore, the through electrode 34 can be easily formed in the lid 3.

The lower surface 311 of the lid 3 as described above is indirectly bonded to the upper surface 412 of the base substrate 41 via the bonding member 6. In this embodiment, the lid 3 and the base substrate 41 are bonded by diffusion bonding also using diffusion between metals among the direct bonding. However, the method of bonding the lid 3 and the base 4 is not particularly limited. Here, in a state where the lid 3 and the base 4 are bonded, some of the plurality of terminals 428 disposed on the base 4 are in contact with the terminals 33 disposed on the lid 3. As a result, the first integrated circuit 42 and the second integrated circuit 32 are electrically coupled via the terminal 33 and the through electrode 34. As described above, by using the through electrode 34 disposed in the lid 3, electrical coupling between the first integrated circuit 42 and the second integrated circuit 32 is facilitated. Further, for example, it is not necessary to route a wiring from an inside of the space S to an outside of the lid 3 to electrically couple the first integrated circuit 42 and the second integrated circuit 32. Therefore, airtightness of the space S can be more reliably ensured.

As described above, the space S that accommodates the vibration element 5 is formed between the lid 3 and the base 4. The space S is airtight and is in a reduced pressure state, preferably in a state closer to a vacuum. Accordingly, a resonation characteristic of the vibration element 5 is improved. However, an atmosphere of the space S is not particularly limited, and may be, for example, an atmosphere filled with an inert gas such as nitrogen and Ar, or may be set to an atmosphere in an atmospheric pressure state or a pressurized state instead of the reduced pressure state.

Next, the vibration element 5 will be described. As shown in FIG. 4, the vibration element 5 includes a vibration substrate 51 and an electrode 52 disposed on a surface of the vibration substrate 51. The vibration substrate 51 has a thickness-shear vibration mode, and is formed by an AT cut quartz crystal substrate in this embodiment. The AT-cut quartz crystal substrate has a third-order frequency temperature characteristic and serves as the vibration element 5 having an excellent temperature characteristic.

The electrode 52 includes an excitation electrode 521 disposed on an upper surface of the vibration substrate 51 and an excitation electrode 522 disposed on a lower surface so as to face the excitation electrode 521 with the vibration substrate 51 interposed therebetween. The electrode 52 includes a pair of terminals 523 and 524 disposed on the lower surface of the vibration substrate 51, a wiring 525 electrically coupling the terminal 523 and the excitation electrode 521, and a wiring 526 electrically coupling the terminal 524 and the excitation electrode 522.

A configuration of the vibration element 5 is not limited to the above configuration. For example, the vibration element 5 may be a mesa type in which a vibration region sandwiched between the excitation electrodes 521 and 522 protrudes from the periphery thereof, or conversely, a reverse mesa type in which the vibration region is recessed from the periphery thereof. A bevel processing for chamfering a corner portion by grinding a periphery of the vibration substrate 51 or a convex processing for making the upper surface and the lower surface as convex curved surfaces may be performed.

The vibration element 5 is not limited to one that resonates in the thickness-shear resonation mode, and for example, a tuning fork type vibration element in which two vibrating arms make tuning-fork resonation in an in-plane direction may be used. That is, the vibration substrate 51 is not limited to the AT-cut quartz crystal substrate, and may be a quartz crystal substrate other than the AT-cut quartz crystal substrate, such as an X-cut quartz crystal substrate, a Y-cut quartz crystal substrate, a Z-cut quartz crystal substrate, a BT-cut quartz crystal substrate, an SC-cut quartz crystal substrate, and an ST-cut quartz crystal substrate. In this embodiment, the vibration substrate 51 is formed from a quartz crystal, but the present disclosure is not limited thereto. For example, the vibration substrate 51 may be formed from a piezoelectric single crystal such as lithium niobate, lithium tantalate, lithium tetraborate, langasite, potassium niobate, gallium phosphate, or other piezoelectric single crystals other than the above. Further, the vibration element 5 is not limited to a piezoelectric-driven vibration element, and may be an electrostatic-driven vibration element using electrostatic force.

The vibration element 5 as described above is fixed to the base 4 by conductive bonding members B1 and B2. Further, the plurality of terminals 428 provided in the first integrated circuit 42 include terminals 428a and 428b for electrically coupling with the vibration element 5, the conductive bonding member B1 fixes the vibration element 5 to the base 4 and electrically couples the terminal 523 and the terminal 428a, and the conductive bonding member B2 fixes the vibration element 5 to the base 4 and electrically couples the terminal 524 and the terminal 428b. Accordingly, the vibration element 5 and the first integrated circuit 42 are electrically coupled via the conductive bonding members B1 and B2.

The conductive bonding members B1 and B2 are not particularly limited as long as the conductive bonding members B1 and B2 have both conductivity and connectivity. For example, various metal bumps such as gold bumps, silver bumps, copper bumps, solder bumps, a conductive adhesive in which a conductive filler such as a silver filler is dispersed in various adhesives based on polyimide, epoxy, silicone and acrylic acid, or the like can be used. When the metal bumps are used as the conductive bonding members B1 and B2, generation of gas from the conductive bonding members B1 and B2 can be prevented, and an environmental change in the space S, in particular, an increase in pressure can be effectively prevented. On the other hand, when the conductive adhesive is used as the conductive bonding members B1 and B2, the conductive bonding members B1 and B2 are softer than the metal bumps, and a stress is hardly generated in the vibration element 5.

Next, the functions of the first integrated circuit 42 and the second integrated circuit 32 will be described. As described above, the first integrated circuit 42 is electrically coupled to the vibration element 5 via the conductive bonding members B1 and B2, the second integrated circuit 32 is electrically coupled to the first integrated circuit 42 via the terminals 33 and the through electrodes 34.

As shown in FIG. 5, in the first integrated circuit 42 and the second integrated circuit 32, the first integrated circuit 42 includes an oscillation circuit 42A that causes the vibration element 5 to oscillate, an A/D converter 42B that converts an analog signal that is temperature information output by the temperature detection element 9 into a digital signal, and a temperature compensation circuit 42C to which the digital signal output from A/D converter 42B is input. Then, the temperature compensation circuit 42C generates a frequency control signal based on the digital signal output from the A/D converter 42B, and outputs the frequency control signal to the oscillation circuit 42A. The oscillation circuit 42A generates and outputs a temperature compensation frequency signal based on this frequency control signal. With the temperature compensation circuit 42C, frequency fluctuation due to a temperature change is prevented, and the vibration device 1 has excellent frequency-temperature characteristics.

Meanwhile, the second integrated circuit 32 includes a processing circuit 32A that processes an oscillation signal output from the oscillation circuit 42A, that is, the temperature compensation frequency signal described above in this embodiment. The processing circuit 32A is not particularly limited, and examples thereof include a multiplication circuit that multiplies the temperature compensation frequency signal, a frequency division circuit that divides the temperature compensation frequency signal, and a phase locked loop (PLL) circuit. The PLL circuit is a phase synchronization circuit that synchronizes phases of an input signal and an output signal, and is configured with, for example, a phase comparator, a loop filter, a voltage controlled oscillator (VCO), and a frequency divider disposed in a feedback loop.

According to such a configuration, the temperature compensation frequency signal can be processed in the vibration device 1, and thus the vibration device 1 is highly convenient. Further, in the first integrated circuit 42 and the second integrated circuit 32, by providing the oscillation circuit 42A in the first integrated circuit 42 directly coupled to the vibration element 5, a wiring length between the vibration element 5 and the oscillation circuit 42A is shortened, and noise is less likely to be carried in the temperature compensation frequency signal output from the oscillation circuit 42A. Further, by providing the processing circuit 32A in the second integrated circuit 32, the oscillation circuit 42A and the processing circuit 32A can be disposed in the vibration device 1 as far apart as possible. Therefore, for example, the oscillation circuit 42A is less likely to be affected by the processing circuit 32A, and accordingly, the noise is less likely to be carried in the temperature compensation frequency signal output from the oscillation circuit 42A. As described above, according to the vibration device 1, the temperature compensation frequency signal with higher accuracy can be generated and output.

In this embodiment, the first integrated circuit 42 and the second integrated circuit 32 are electrically coupled in the vibration device 1, but the present disclosure is not limited thereto, and for example, the first integrated circuit 42 and the second integrated circuit 32 may be electrically coupled with each other outside the vibration device 1. For example, the first integrated circuit 42 and the second integrated circuit 32 may be electrically coupled on a circuit substrate on which the vibration device 1 is mounted. Further, the first integrated circuit 42 and the second integrated circuit 32 may not be electrically coupled to each other inside or outside the vibration device 1, and may be independent circuits. The functions of the first integrated circuit 42 and the second integrated circuit 32 are not particularly limited.

The vibration device 1 is described above. Such the vibration device 1, as described above, includes the base 4 serving as the first substrate having the lower surface 411 that is the first surface and the upper surface 412 that is the second surface located at the opposite side of the lower surface 411 and a first integrated circuit 42 disposed at least one of the lower surface 411 and the upper surface 412, that is, on the upper surface 412 in this embodiment, the lid 3 serving as the second substrate having the lower surface 311 that is the third surface bonded to the upper surface 412, the upper surface 312 that is the fourth surface located at the opposite side of the lower surface 311, the recess 313 that opens to the lower surface 311, and the second integrated circuit 32 disposed on the upper surface 312, and the vibration element 5 accommodated in the space S defined by the opening of the recess 313 being closed by the base 4.

According to such a configuration, the space S for accommodating the vibration element 5 is formed by a laminate of the base 4 and the lid 3, that is, the two substrates. Therefore, as compared with the configuration in which the space S that accommodates the vibration element 5 is formed by three substrates as in the above-described technique of the related art, the vibration device 1 can be miniaturized, particularly thinned. Further, since the first integrated circuit 42 is disposed on the base 4 and the second integrated circuit 32 is disposed on the lid 3, a sufficient large circuit formation region in the vibration device 1 can be ensured. Therefore, a degree of freedom in circuit design is increased, and a circuit having excellent characteristics can be formed.

Further, as described above, the vibration element 5 is fixed to the base 4. Accordingly, it is easy to fix the vibration element 5 so as to be disposed at an appropriate position in the space S. Specifically, the bottom surface of the recess 313 can be considered as a portion for fixing the vibration element 5 in addition to the upper surface 412 as in this embodiment. However, around the bottom surface of the recess 313, there is a wall portion, a side surface of the recess, standing upright from the bottom surface, and therefore the wall portion may hinder the fixing of the vibration element 5 to the bottom surface of the recess 313. In contrast, since the upper surface 412 is a substantially planar surface and there is no wall portion therearound, the fixing of the vibration element 5 is not hindered. Therefore, the vibration element 5 can be easily fixed.

Further, as described above, the first integrated circuit 42 includes the oscillation circuit 42A that causes the vibration element 5 to oscillate, and the second integrated circuit 32 includes the processing circuit 32A that processes the oscillation signal output from the oscillation circuit 42A. According to such a configuration, the temperature compensation frequency signal can be processed in the vibration device 1, and thus the vibration device 1 is highly convenient. Further, by providing the oscillation circuit 42A in the first integrated circuit 42 directly coupled to the vibration element 5, the wiring length between the vibration element 5 and the oscillation circuit 42A is shortened, and the noise is less likely to be carried in the temperature compensation frequency signal output from the oscillation circuit 42A. Further, by providing the processing circuit 32A in the second integrated circuit 32, the oscillation circuit 42A and the processing circuit 32A can be disposed in the vibration device 1 as far apart as possible. Therefore, for example, the oscillation circuit 42A is less likely to be affected by the processing circuit 32A, and accordingly, the noise is less likely to be carried in the temperature compensation frequency signal output from the oscillation circuit 42A.

Further, as described above, the vibration device 1 has the temperature detection element 9 that detects the temperature of the vibration element 5. Further, one of the first integrated circuit 42 and the second integrated circuit 32, that is, the first integrated circuit 42 in this embodiment includes the temperature compensation circuit 42C that performs temperature compensation of the oscillation signal based on a detection result of the temperature detection element 9. As a result, the frequency fluctuation due to the temperature change is prevented, and the vibration device 1 has the excellent frequency-temperature characteristics.

In addition, as described above, the lid 3 has the through electrode 34 that electrically couples the first integrated circuit 42 and the second integrated circuit 32. As described above, by disposing the through electrode 34 in the lid 3, the electrical coupling between the first integrated circuit 42 and the second integrated circuit 32 is facilitated. Further, for example, it is not necessary to route the wiring from the inside of the space S to the outside of the lid 3 to electrically couple the first integrated circuit 42 and the second integrated circuit 32. Therefore, the airtightness of the space S can be more reliably ensured.

Further, as described above, no integrated circuit is disposed on the lower surface 311 of the lid 3. As a result, the through electrode 34 can be easily formed in the lid 3.

Further, as described above, the first integrated circuit 42 is disposed on one of the lower surface 411 and the upper surface 412, that is, the upper surface 412 in this embodiment. As a result, the configuration of the base 4 and the formation thereof are easier than, for example, the case of disposing the first integrated circuit 42 on both of the lower surface 411 and the upper surface 412. Particularly, in this embodiment, the first integrated circuit 42 is disposed on the upper surface 412. Therefore, the exposure of the first integrated circuit 42 to the outside of the vibration device 1 is prevented, and the first integrated circuit 42 can be protected from moisture, contact, dust, and the like.

Second Embodiment

Figure 6:
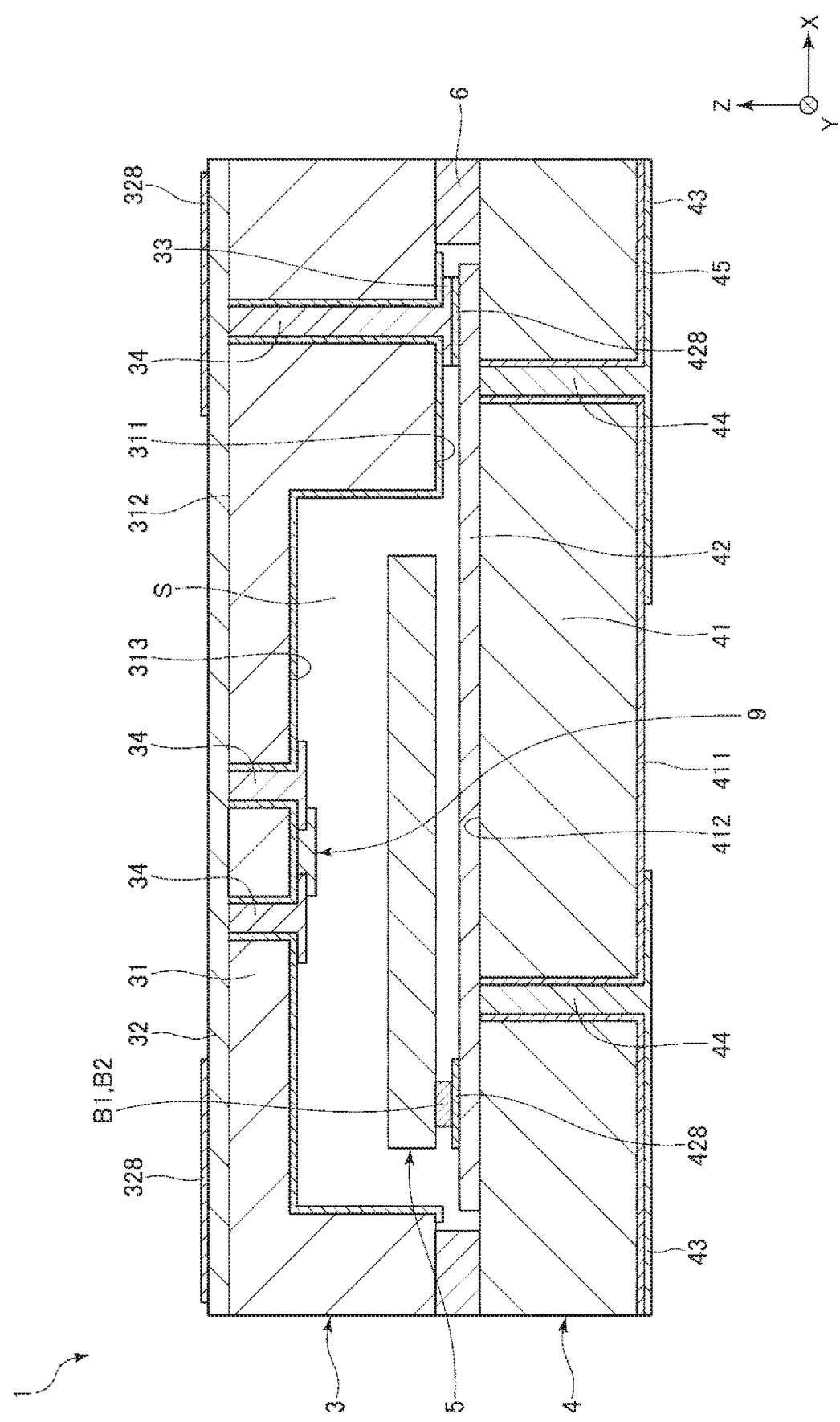
FIG. 6 is a cross-sectional view showing a vibration device according to a second embodiment.

FIG. 6 is a cross-sectional view showing a vibration device according to a second embodiment.

A vibration device 1 according to this embodiment is similar to the vibration device 1 according to the above first embodiment except that an arrangement of the temperature detection element 9 is different. In the following description, the vibration device 1 according to the second embodiment will be described focusing on differences from the first embodiment, and the description of similar matters will be omitted. In FIG. 6, the same components as those in the above-described embodiment are designated by the same reference numerals.

As shown in FIG. 6, in the vibration device 1 of this embodiment, the temperature detection element 9 is disposed on the bottom surface of the recess 313, and the temperature detection element 9 is electrically coupled to the second integrated circuit 32 via the through electrodes 34 disposed in the base substrate 31. The temperature compensation circuit 42C using the detection result of the temperature detection element 9 may be disposed in the first integrated circuit 42 as in the above-described first embodiment, or may be disposed in the second integrated circuit 32 unlike the first embodiment.

Similar effect as in the above-described first embodiment can also be exhibited in the second embodiment described above.

Third Embodiment

Figure 7:
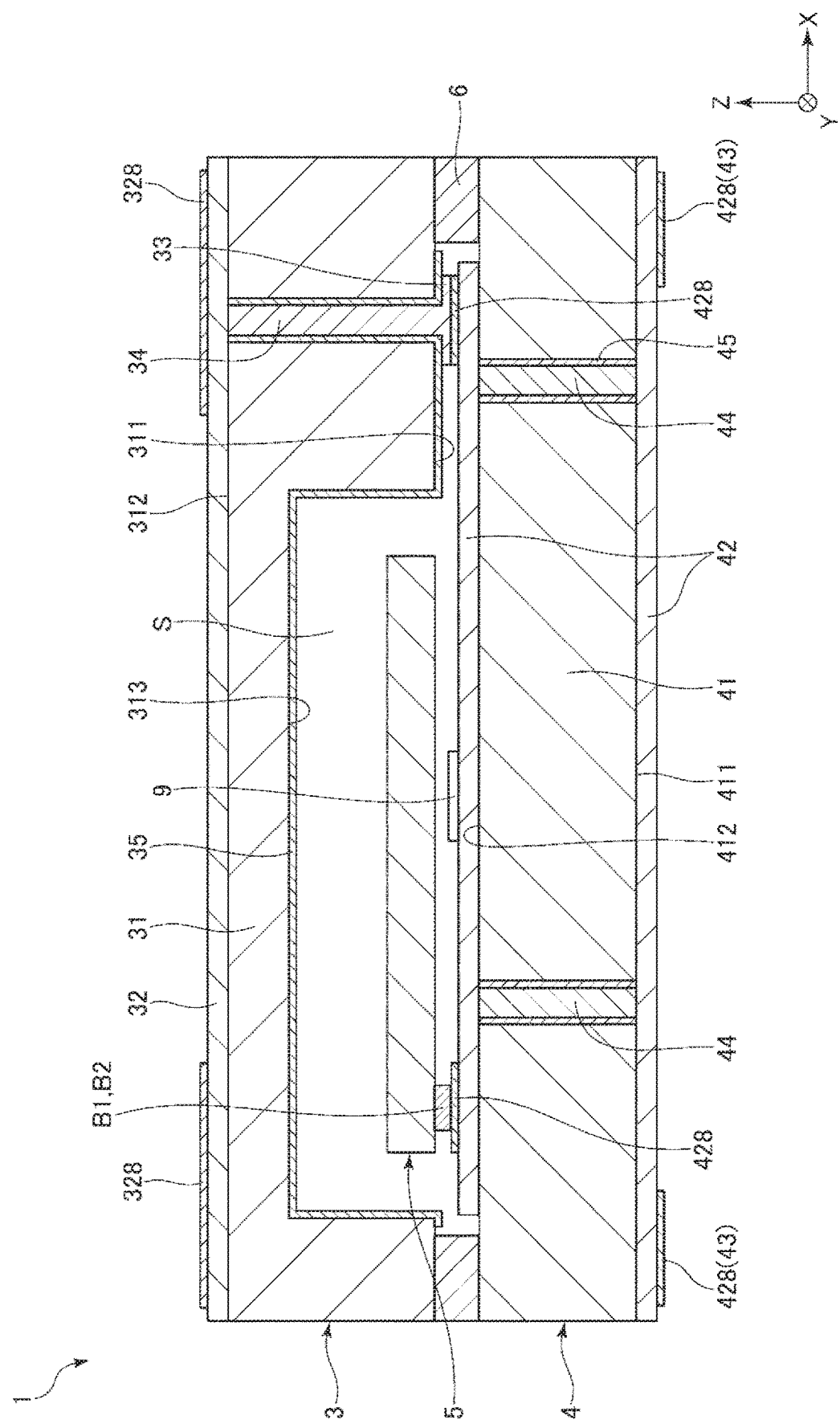
FIG. 7 is a cross-sectional view showing a vibration device according to a third embodiment.

FIG. 7 is a cross-sectional view showing a vibration device according to a third embodiment.

A vibration device 1 according to this embodiment is similar to the vibration device 1 according to the above first embodiment except that an arrangement of the first integrated circuit 42 is different. In the following description, the vibration device 1 according to the third embodiment will be described focusing on differences from the first embodiment, and the description of similar matters will be omitted. In FIG. 7, the same components as those in the above-described embodiment are designated by the same reference numerals.

As shown in FIG. 7, in the vibration device 1 of this embodiment, the first integrated circuit 42 is disposed on the upper surface 412 and the lower surface 411 of the base substrate 41. That is, the first integrated circuit 42 is disposed on both surfaces of the base substrate 41. Therefore, as compared with the case where the first integrated circuit 42 is disposed only on one surface of the base 4, an area of the first integrated circuit 42 is increased, and accordingly, a degree of freedom in designing the first integrated circuit 42 is increased. The first integrated circuit 42 on the upper surface 412 and the first integrated circuit 42 on the lower surface 411 are electrically coupled by the through electrode 44, and the terminal 428 provided in the first integrated circuit 42 on the lower surface 411 also serves as the terminal 43.

Similar effect as in the above-described first embodiment can also be exhibited in the third embodiment described above.

Fourth Embodiment

Figure 8:
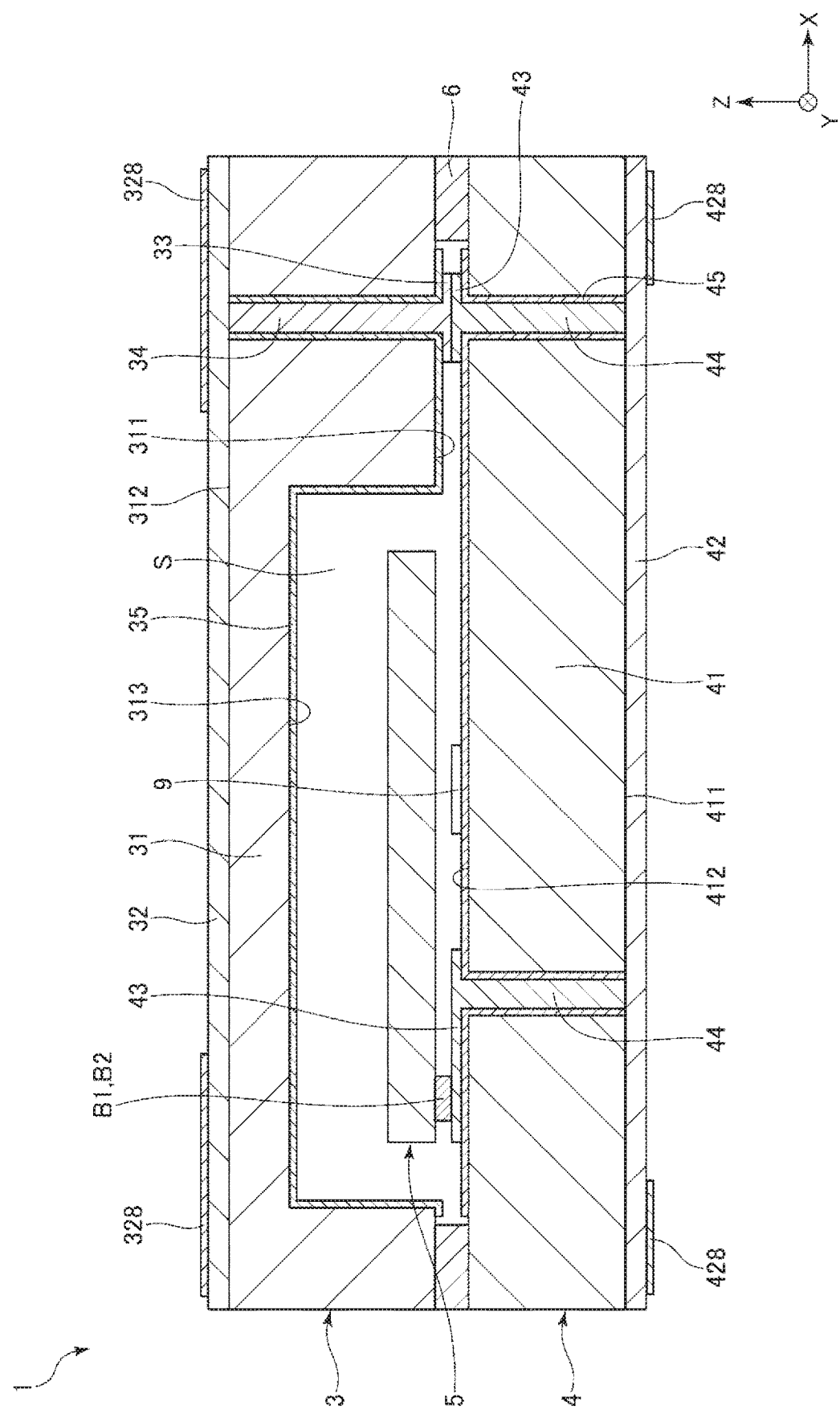
FIG. 8 is a cross-sectional view showing a vibration device according to a fourth embodiment.

FIG. 8 is a cross-sectional view showing a vibration device according to a fourth embodiment.

A vibration device 1 according to this embodiment is similar to the vibration device 1 according to the above first embodiment except that an arrangement of the first integrated circuit 42 is different. In the following description, the vibration device 1 according to the fourth embodiment will be described focusing on differences from the first embodiment, and the description of similar matters will be omitted. In FIG. 8, the same components as those in the above-described embodiment are designated by the same reference numerals.

As shown in FIG. 8, in the vibration device 1 of this embodiment, the first integrated circuit 42 is disposed on the lower surface 411 of the base substrate 41. That is, the first integrated circuit 42 is not disposed on the upper surface 412 of the base substrate 41. In other words, the base 4 of this embodiment is set to an upside-down posture with respect to the base 4 of the first embodiment described above. Therefore, a plurality of terminals 43 are provided on the upper surface 412 of the base substrate 41. Further, the first integrated circuit 42 is electrically coupled to the vibration element 5 via the through electrode 44 and the terminal 43, and meanwhile, is electrically coupled to the second integrated circuit 32 via another through electrode 44 and the terminals 43. Although not shown, the temperature detection element 9 disposed on the upper surface 412 is also electrically coupled to the first integrated circuit 42 via the through electrode 44.

As described above, by disposing the first integrated circuit 42 on the lower surface 411, for example, as compared with the configuration in which the first integrated circuit 42 is disposed on the upper surface 412 as in the above-described first embodiment, a region where the first integrated circuit 42 can be formed is widened. Therefore, the degree of the freedom in designing the first integrated circuit 42 is increased. This is because when the first integrated circuit 42 is disposed on the upper surface 412, the first integrated circuit 42 cannot be formed at a portion bonding with the lid 3, or even if it is possible, it is not preferable, and accordingly, the region where the first integrated circuit 42 can be formed is reduced. In contrast, when the first integrated circuit 42 is disposed on the lower surface 411, the problem as described above does not occur, and an entire area of the lower surface 411 is the region where the first integrated circuit 42 can be formed.

Similar effect as in the above-described first embodiment can also be exhibited in the fourth embodiment described above.

Fifth Embodiment

Figure 9:
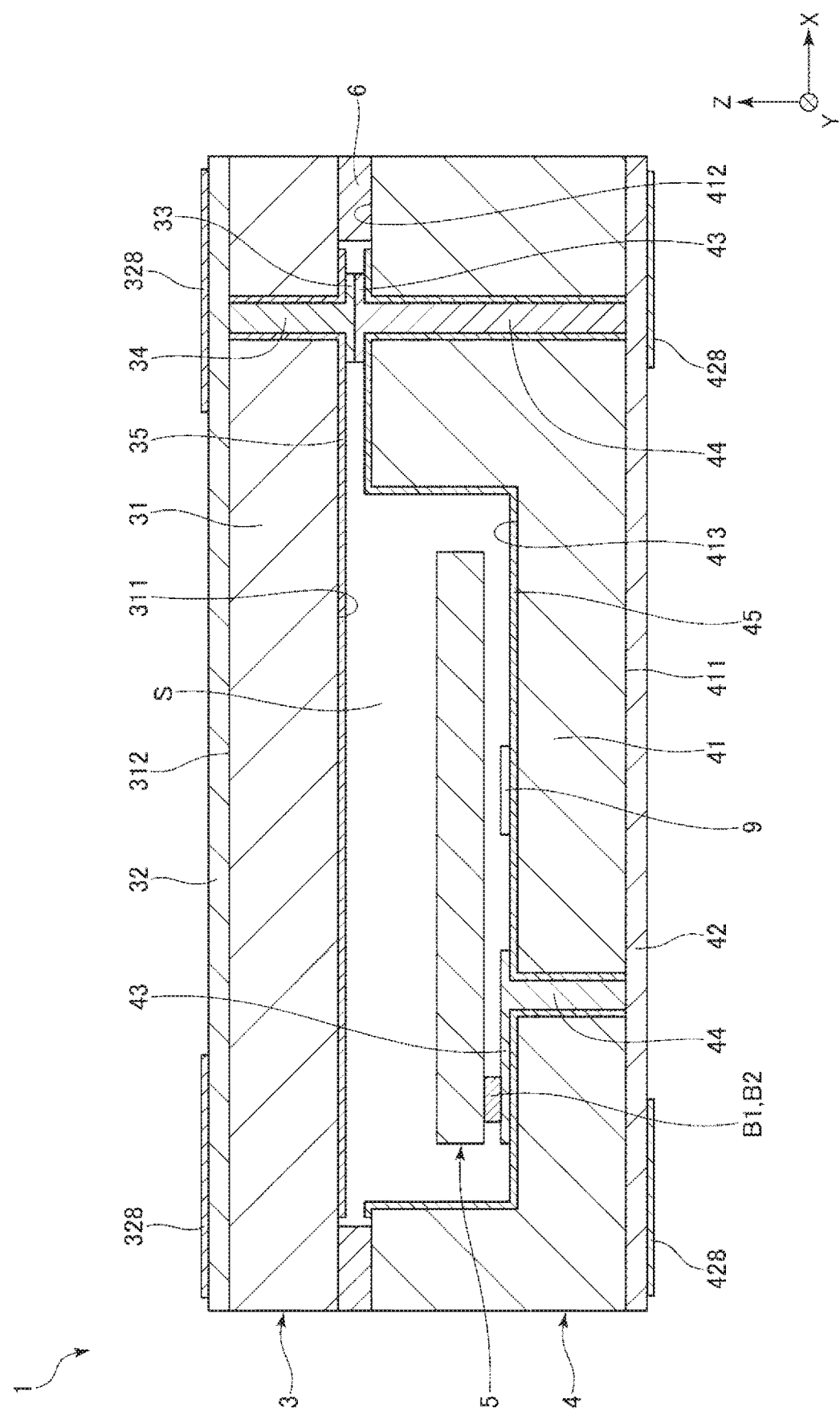
FIG. 9 is a cross-sectional view showing a vibration device according to a fifth embodiment.

FIG. 9 is a cross-sectional view showing a vibration device according to a fifth embodiment.

A vibration device 1 according to this embodiment is similar to the vibration device 1 according to the above fourth embodiment except that configurations of the base 4 and the lid 3 are different. In the following description, the vibration device 1 according to the fifth embodiment will be described focusing on differences from the fourth embodiment, and the description of similar matters will be omitted. In FIG. 9, the same components as those in the above-described embodiment are designated by the same reference numerals.

As shown in FIG. 9, in the vibration device 1 of this embodiment, the recess 313 is omitted from the lid 3, and instead, the base 4 has a recess 413 that opens to the upper surface 412. Further, the vibration element 5 is fixed to a bottom surface of the recess 413. In this embodiment, the lid 3 corresponds to the first substrate and the base 4 corresponds to the second substrate. Since the base 4 has the recess 413, the second integrated circuit 32 of the lid 3 is disposed on at least one of the upper surface 312 and the lower surface 311. The first integrated circuit 42 of the base 4 is disposed on the lower surface 411 and is not disposed on the upper surface 412.

Similar effect as in the above-described first embodiment can also be exhibited in the fifth embodiment described above.

Sixth Embodiment

Figure 10:
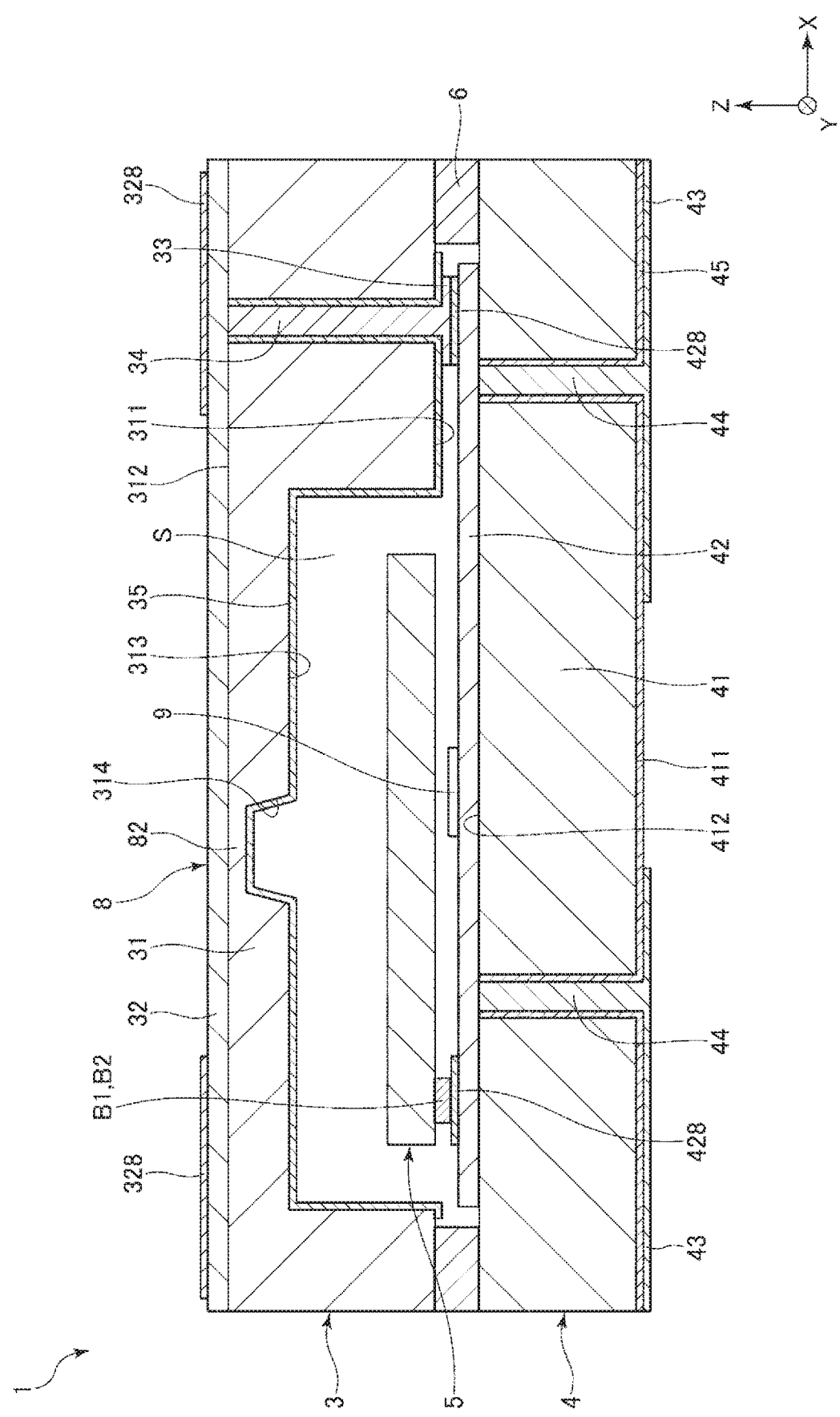
FIG. 10 is a cross-sectional view showing a vibration device according to a sixth embodiment.
Figure 11:
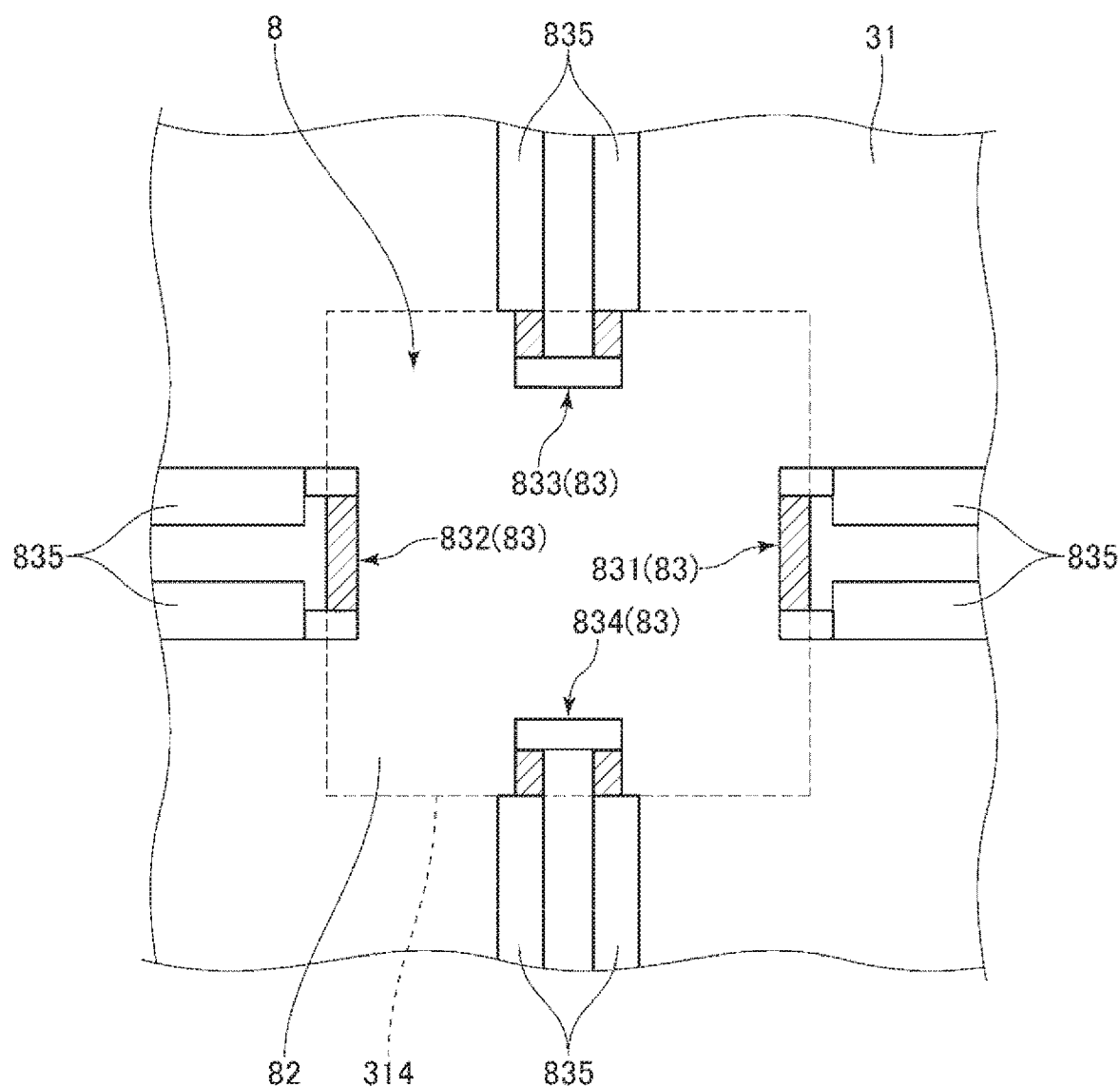
FIG. 11 is a plan view showing a surface of a diaphragm.
Figure 12:
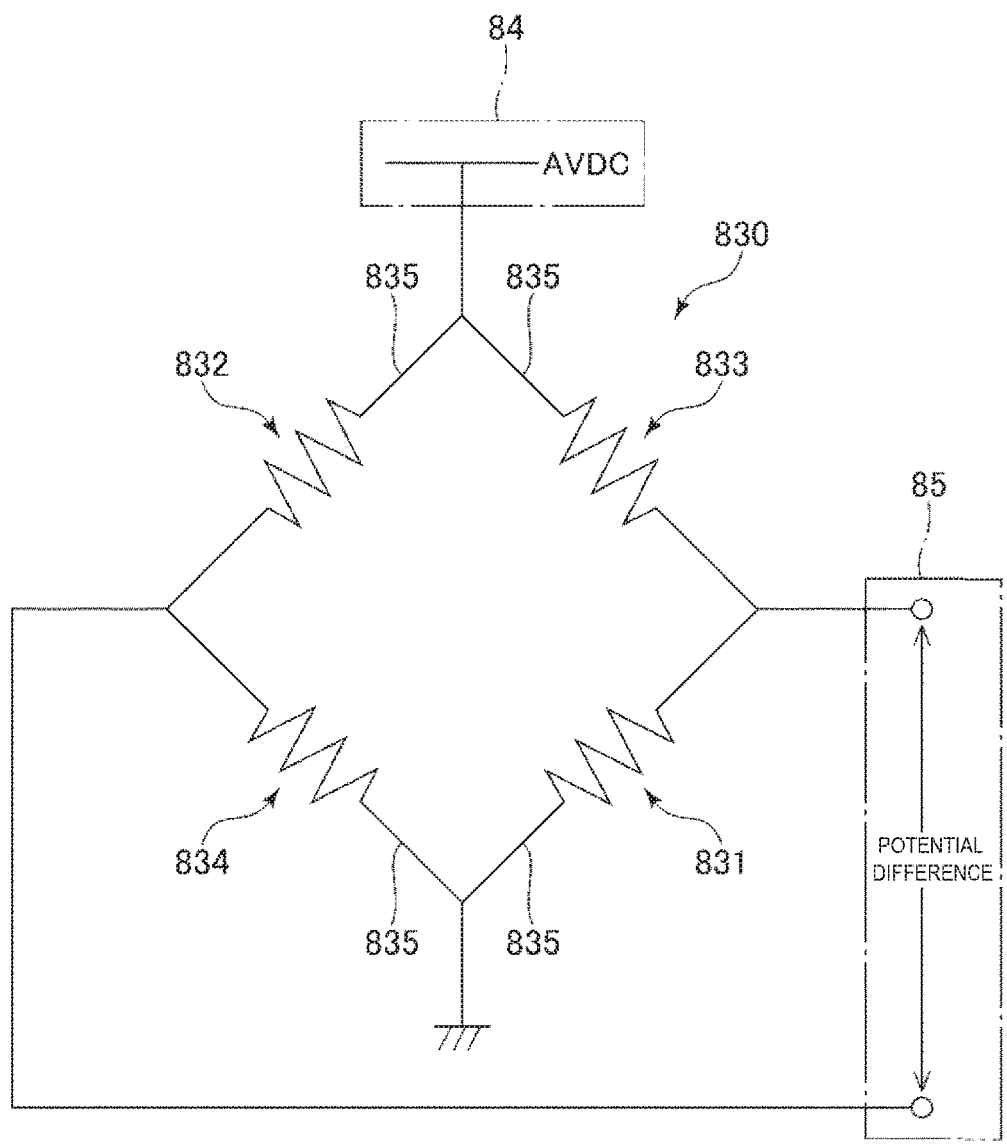
FIG. 12 is a circuit diagram showing a bridge circuit.
Figure 13:
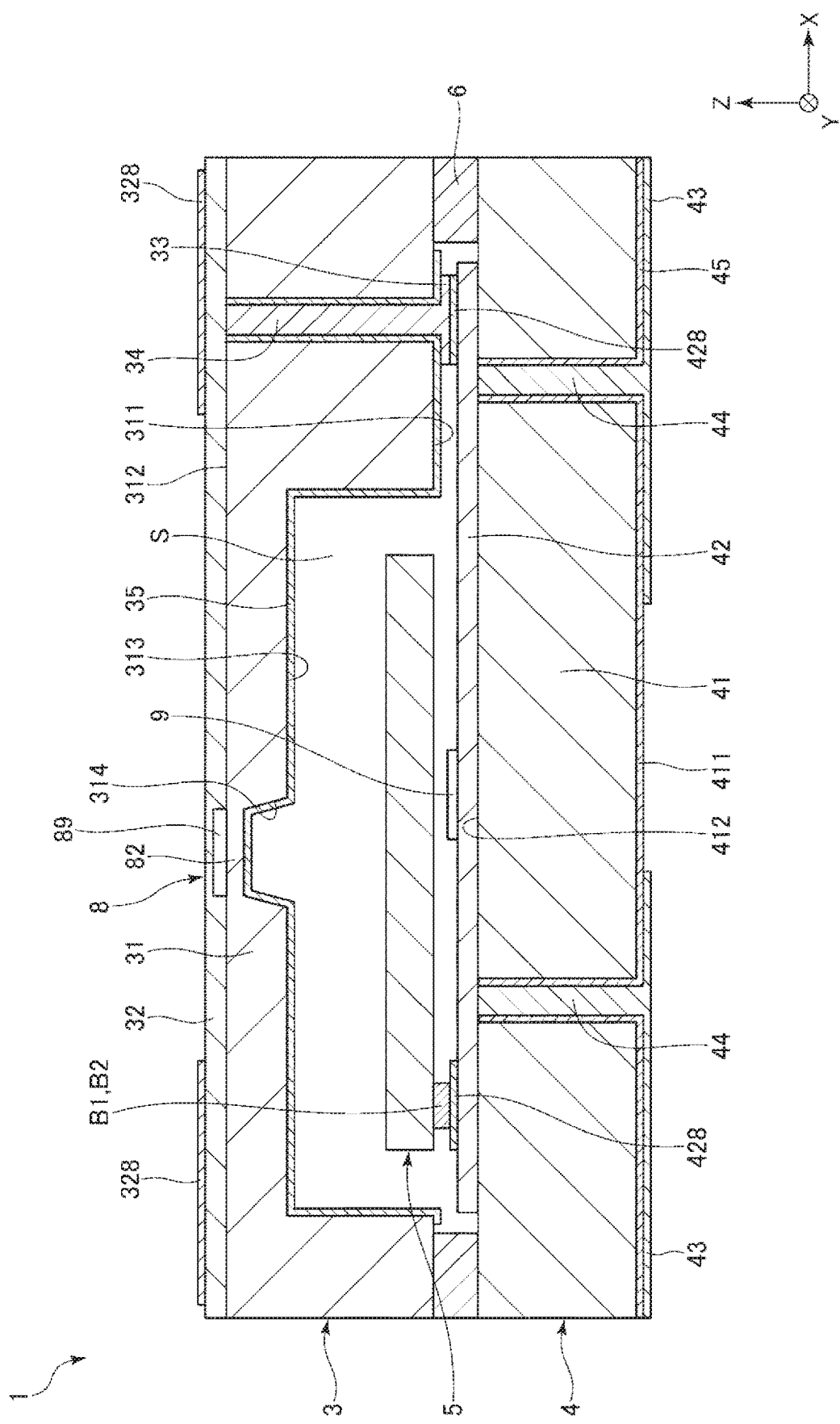
FIG. 13 is a cross-sectional view showing a modification of the vibration device shown in FIG. 10.

FIG. 10 is a cross-sectional view showing a vibration device according to a sixth embodiment. FIG. 11 is a plan view showing a surface of a diaphragm. FIG. 12 is a circuit diagram showing a bridge circuit. FIG. 13 is a cross-sectional view showing a modification of the vibration device shown in FIG. 10.

A vibration device 1 according to this embodiment is similar to the vibration device 1 according to the above first embodiment except that the vibration device 1 further includes a pressure detection unit 8. In the following description, the vibration device 1 according to the sixth embodiment will be described focusing on differences from the first embodiment, and the description of similar matters will be omitted. In FIG. 10, the same components as those in the above-described embodiment are designated by the same reference numerals.

As shown in FIG. 10, in the vibration device 1 of this embodiment, the pressure detection unit 8 that detects a pressure inside the space S is disposed in the lid 3. As described above, by disposing the pressure detection unit 8, whether or not an airtight state of the space S is maintained can be confirmed, and if the airtight state is not maintained, it can be determined that a failure occurs. Therefore, the vibration device 1 with higher reliability is obtained.

The pressure detection unit 8 has a diaphragm 82 that is bent and deformed by receiving a pressure. The recess 314 that opens to the bottom surface of the recess 313 is disposed on the base substrate 31, and the diaphragm 82 is formed at the bottom surface of the recess 314, which is thinner than surroundings. Further, as shown in FIG. 11, a sensor unit 83 that detects a differential pressure between a pressure applied to the diaphragm 82, that is, the pressure inside the space S and an external pressure is disposed on the diaphragm 82.

The sensor unit 83 has four piezoresistive elements 831, 832, 833, 834 provided on the diaphragm 82. These piezoresistive elements 831, 832, 833, 834 are electrically coupled to one another via a wiring 835 to form a Wheatstone bridge circuit 830 shown in FIG. 12. The above Wheatstone bridge circuit 830 outputs a detection signal corresponding to a resistance value change of the piezoresistive elements 831, 832, 833, 834 based on bending of the diaphragm 82. Therefore, the differential pressure applied to the diaphragm 82 can be detected based on this detection signal. In this way, the pressure detection unit 8 of this embodiment detects the "pressure inside the space S" as the "differential pressure between the pressure inside the space S and an external pressure".

A drive circuit 84 that applies a drive voltage AVDC to the Wheatstone bridge circuit 830 and a detection circuit 85 that detects the differential pressure applied to the diaphragm 82 based on the detection signal are coupled, and the Wheatstone bridge circuit 830, the drive circuit 84 and the detection circuit 85 are respectively disposed in the second integrated circuit 32.

However, a configuration of the pressure detection unit 8 is not particularly limited. For example, the pressure detection unit 8 may be disposed on the base 4, or may be disposed on both the lid 3 and the base 4. Further, for example, as shown in FIG. 13, by using the insulating films 322 and 324 and the wirings 323 and 325 of the second integrated circuit 32, a pressure reference chamber 89 having a constant pressure is formed at a position overlapping with the diaphragm 82, and the pressure detection unit 8 may be configured to detect a differential pressure between a pressure inside the pressure reference chamber 89 and the pressure inside the space S. According to such a configuration, since the pressure detection unit 8 functions as an absolute pressure sensor, the pressure inside the space S can be detected more accurately.

As described above, the pressure detection unit 8 that detects the pressure inside the space S is disposed in at least one of the base 4 and the lid 3, that is, the lid 3 in this embodiment. As described above, by disposing the pressure detection unit 8, whether or not an airtight state of the space S is maintained can be confirmed, and if the airtight state is not maintained, it can be determined that a failure occurs. Therefore, the vibration device 1 with higher reliability is obtained.

Similar effect as in the above-described first embodiment can also be exhibited in the sixth embodiment described above.

Seventh Embodiment

Figure 14:
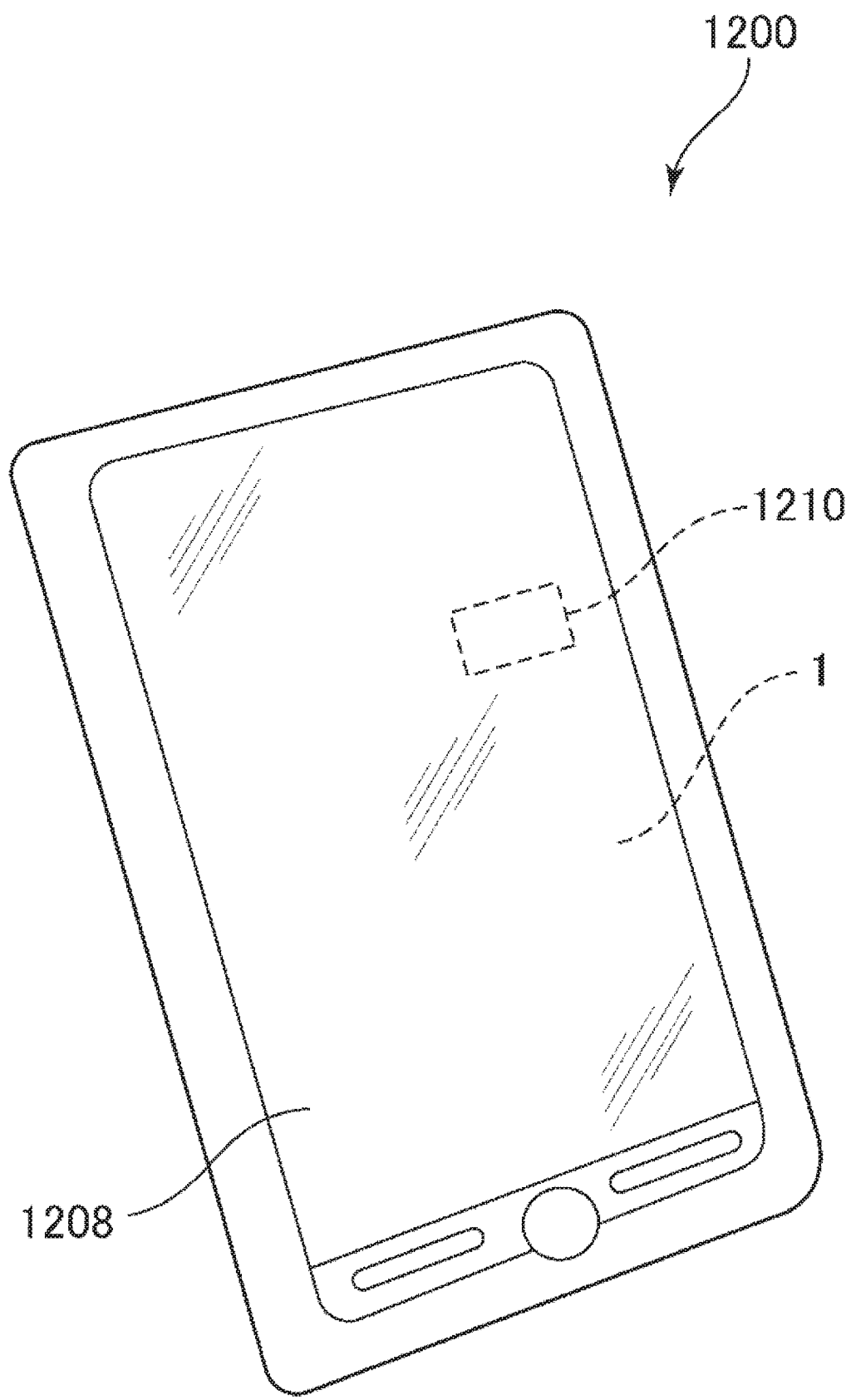
FIG. 14 is a perspective view showing a smartphone according to a seventh embodiment.

FIG. 14 is a perspective view showing a smartphone according to a seventh embodiment.

A smartphone 1200 shown in FIG. 14 is an electronic apparatus to which the present disclosure is applied. The smartphone 1200 includes the vibration device 1 used as an oscillator and an arithmetic processing circuit 1210 that operates based on a signal output from the vibration device 1. The arithmetic processing circuit 1210, for example, based on an input signal input from a screen 1208, can change a display screen, launch a specific application, output a warning sound or a sound effect, and drive a vibration motor to vibrate a body.

As described above, the smartphone 1200 as the electronic apparatus includes the vibration device 1 and the arithmetic processing circuit 1210 that operates based on the signal output from the vibration device 1. Therefore, the effect of the vibration device 1 described above can be obtained and the high reliability can be exhibited.

The electronic apparatus including the vibration device 1 can be applied to, for example, personal computers, digital still cameras, watches, smart watches, printers, TVs, wearable terminals, video cameras, video recorders, car navigation devices, drive recorders, electronic dictionaries, electronic game devices, toys, workstations, electronic binoculars, point of sales (POS) terminals, medical equipment, various measurement equipment, vehicle terminal base station equipment, various vehicle instruments, flight simulators, network servers, and the like, in addition to the smartphone 1200 described above.

Eighth Embodiment

Figure 15:
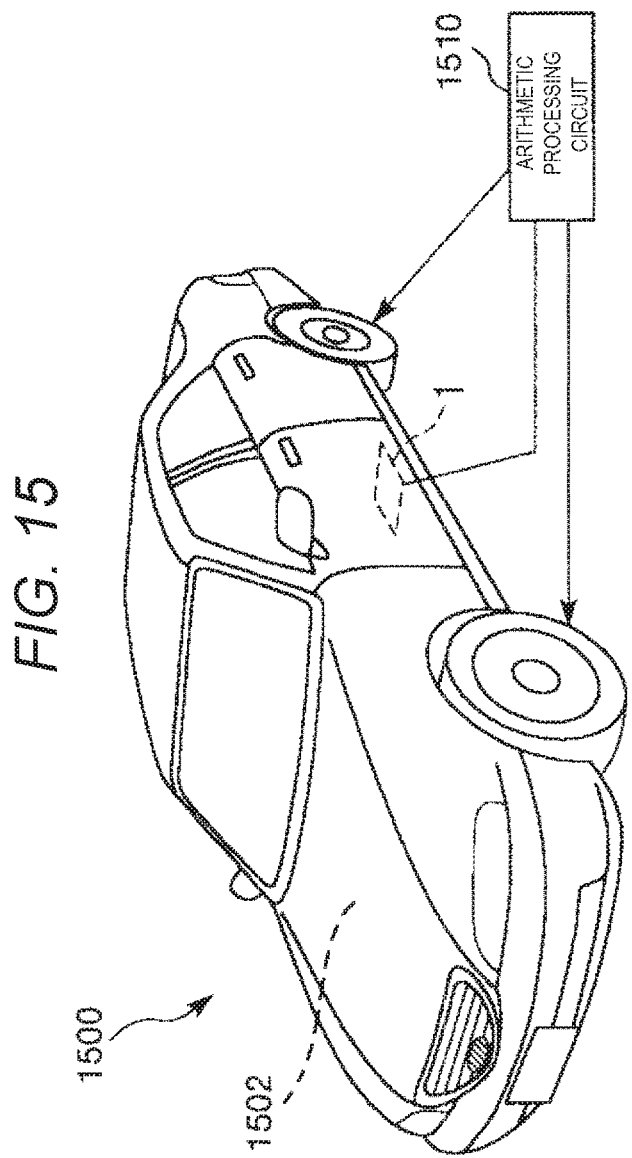
FIG. 15 is a perspective view showing an automobile according to an eighth embodiment.

FIG. 15 is a perspective view showing an automobile according to an eighth embodiment.

An automobile 1500 serving as a vehicle shown in FIG. 15 includes a system 1502 such as an engine system, a brake system, and a keyless entry system. Further, the automobile 1500 includes the vibration device 1 used as an oscillator and an arithmetic processing circuit 1510 that operates based on a signal output from the vibration device 1 and controls the system 1502.

As described above, the automobile 1500 as the vehicle includes the vibration device 1 and the arithmetic processing circuit 1510 that operates based on the signal output from the vibration device 1. Therefore, the effect of the vibration device 1 described above can be obtained and the high reliability can be exhibited.

In addition to the automobile 1500, examples of the vehicle including the vibration device 1 may include a robot, a drone, a motorcycle, an aircraft, a ship, an electric car, a rocket, a spacecraft, and the like.

The vibration device, the electronic apparatus, and the vehicle according to the present disclosure are described above based on the illustrated embodiments, but the present disclosure is not limited thereto, and a configuration of each part can be replaced with any configuration having a similar function. Any other components may be added to the present disclosure. The present disclosure may be a combination of any two or more configurations of the above embodiments.

What is claimed is:

1. A vibration device comprising:
   a first substrate including
      a first surface and a second surface located at an opposite side of the first surface, and
      a first integrated circuit disposed on at least one of the first surface and the second surface;
   a second substrate including
      a third surface bonded to the second surface,
      a fourth surface located at an opposite side of the third surface,
      a recess that opens to the third surface, and
      a second integrated circuit disposed on the fourth surface; and
   a vibration element accommodated in a space defined by an opening of the recess being closed by the first substrate.

2. The vibration device according to claim 1, wherein the vibration element is fixed to the first substrate.

3. The vibration device according to claim 2, wherein the first integrated circuit includes an oscillation circuit configured to cause the vibration element to oscillate, and
   the second integrated circuit includes a processing circuit configured to process an oscillation signal output from the oscillation circuit.

4. The vibration device according to claim 3, further comprising:
   a temperature detection element configured to detect a temperature of the vibration element, wherein
   one of the first integrated circuit and the second integrated circuit includes a temperature compensation circuit configured to perform temperature compensation of the oscillation signal based on a detection result of the temperature detection element.

5. The vibration device according to claim 1, wherein the second substrate includes a through electrode that electrically couples the first integrated circuit and the second integrated circuit.

6. The vibration device according to claim 1, wherein an integrated circuit is not disposed on the third surface.

7. The vibration device according to claim 1, wherein the first integrated circuit is disposed on any one of the first surface and the second surface.

8. The vibration device according to claim 1, wherein a pressure detection unit configured to detect a pressure inside the space is disposed on at least one of the first substrate and the second substrate.

9. An electronic apparatus comprising:
the vibration device according to claim 1; and
an arithmetic processing circuit configured to operate based on a signal output from the vibration device.

10. A vehicle comprising:
the vibration device according to claim 1; and
an arithmetic processing circuit configured to operate based on a signal output from the vibration device.

* * * * *